United States Patent
Saitou et al.

(10) Patent No.: US 11,527,404 B2
(45) Date of Patent: Dec. 13, 2022

(54) SUBSTRATE PROCESSING APPARATUS AND SUBSTRATE PROCESSING METHOD

(71) Applicant: TOKYO ELECTRON LIMITED, Tokyo (JP)

(72) Inventors: Tetsuya Saitou, Nirasaki (JP); Takashi Kamio, Nirasaki (JP); Kazuyoshi Yamazaki, Nirasaki (JP); Naoshige Fushimi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 356 days.

(21) Appl. No.: 16/818,491

(22) Filed: Mar. 13, 2020

(65) Prior Publication Data
US 2020/0294799 A1     Sep. 17, 2020

(30) Foreign Application Priority Data
Mar. 15, 2019   (JP) .............................. JP2019-049162

(51) Int. Cl.
*H01L 21/02*    (2006.01)
*H01L 21/67*    (2006.01)

(52) U.S. Cl.
CPC .. *H01L 21/02249* (2013.01); *H01L 21/02164* (2013.01); *H01L 21/02252* (2013.01); *H01L 21/02255* (2013.01); *H01L 21/67115* (2013.01)

(58) Field of Classification Search
None
See application file for complete search history.

(56) References Cited

FOREIGN PATENT DOCUMENTS

| JP | S60-212221 A | 10/1985 |
|---|---|---|
| JP | 2001-176865 A | 6/2001 |
| JP | 2004-119522 A | 4/2004 |
| KR | 10-2001-0020883 A | 3/2001 |

*Primary Examiner* — Alexander G Ghyka
(74) *Attorney, Agent, or Firm* — Nath, Goldberg & Meyer; Jerald L. Meyer; Tanya E. Harkins

(57) ABSTRACT

An apparatus includes: a processing container; a stage provided inside the processing container to place a substrate thereon; a gas supply mechanism for supplying a processing gas into the processing container; and at least three ultraviolet light sources provided to irradiate the processing gas inside the processing container with ultraviolet rays. The ultraviolet light sources are provided to be offset from a rotation axis of the stage in a plan view, and are arranged in a light source arrangement direction with distances from the ultraviolet light sources to the rotation axis being different from one another. The ultraviolet light sources include first to third ultraviolet light source. The third ultraviolet light source is arranged such that distances L1, L2, and L3 from the first to third ultraviolet light sources, respectively, to the rotation axis in a plan view satisfies a relationship of L1<L3<L2.

19 Claims, 5 Drawing Sheets

SUBSTRATE PROCESSING APPARATUS AND SUBSTRATE PROCESSING METHOD

CROSS-REFERENCE TO RELATED APPLICATION

This application is based upon and claims the benefit of priority from Japanese Patent Application No. 2019-049162, filed on Mar. 15, 2019, the entire contents of which are incorporated herein by reference.

TECHNICAL FIELD

The present disclosure relates to a substrate processing apparatus and a substrate processing method.

BACKGROUND

Patent Document 1 discloses a substrate processing apparatus in which an oxide film is formed on a silicon substrate by performing an ultraviolet radical oxidation process on the silicon substrate, and a radical nitridation process is performed on the oxide film using high-frequency remote plasma. Such a substrate processing apparatus includes a processing container in which an internal processing space is defined, a holding member that holds a substrate to be processed loaded into the processing space, a rotational driving part that rotates a shaft of the holding member, and two ultraviolet light sources that irradiate the processing space with ultraviolet rays.

PRIOR ART DOCUMENT

Patent Document

Patent Document 1: Japanese Laid-Open Patent Publication No. 2004-119522

SUMMARY

According to an embodiment of the present disclosure, there is provided a substrate processing apparatus for processing a substrate, including: a processing container in which the substrate is accommodated; a stage provided inside the processing container, and configured to place the substrate thereon and rotate about a rotation axis thereof; a gas supply mechanism configured to supply a processing gas into the processing container; and at least three ultraviolet light sources provided in an area that faces a placement surface of the stage on which the substrate is placed, and configured to irradiate the processing gas inside the processing container with ultraviolet rays, wherein irradiation intensities of the ultraviolet rays irradiated from the at least three ultraviolet light sources are the same, wherein the at least three ultraviolet light sources are provided to be offset from the rotation axis of the stage in a plan view, and are arranged in a light source arrangement direction that is a predetermined direction parallel to the placement surface of the stage in a plan view with distances from the at least three ultraviolet light sources to the rotation axis of the stage being different from one another, wherein the at least three ultraviolet light sources include a first ultraviolet light source disposed closest to the rotation axis of the stage in a plan view, a second ultraviolet light source disposed at an outermost position in a plan view and arranged near a peripheral edge of the stage, and a third ultraviolet light source other than the first and second ultraviolet light sources, and wherein the third ultraviolet light source is arranged such that distances $L_1$, $L_2$, and $L_3$ from the first ultraviolet light source, the second ultraviolet light source, and the third ultraviolet light source, respectively, to the rotation axis of the stage in a plan view satisfies a relationship of $L_1<L_3<L_2$.

BRIEF DESCRIPTION OF DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
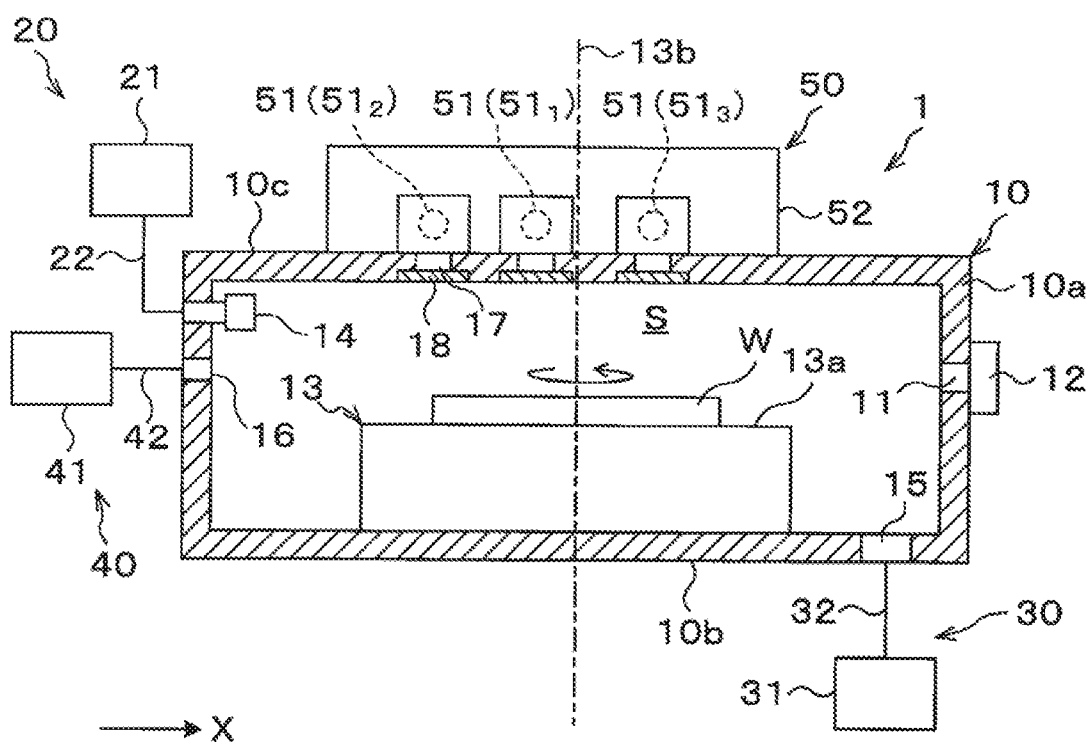
FIG. 1 is a vertical cross-sectional view schematically illustrating an outline of a configuration of a substrate processing apparatus according to a present embodiment.

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

As an oxide film producing apparatus for generating an oxide film on a semiconductor wafer (hereinafter, referred to as a "wafer"), there is known an apparatus that irradiates ultraviolet rays to the interior of a processing container while supplying a processing gas containing an oxygen gas into the processing container in which a processing space for processing a wafer is formed (see e.g., Patent Document 1). The ultraviolet rays are absorbed by the oxygen gas in the processing gas so that oxygen radicals are generated on a front surface of the wafer. The front surface of the wafer is oxidized by the oxygen radicals to form an oxide film. Further, the substrate processing apparatus disclosed in Patent Document 1 has two ultraviolet light sources that irradiate ultraviolet light to the processing space in the processing container.

In addition, the above-described oxide film producing apparatus is provided with a rotational driving mechanism that rotates a holder for holding the wafer such that uniform film formation is performed on the front surface of the wafer.

In the oxide film producing apparatus provided with the two ultraviolet light sources and the rotational driving mechanism as described above, one of the two ultraviolet light sources is provided at a position slightly offset from the center of the holder, namely the center of the wafer in a plan view, and the other one is disposed at a position corresponding to peripheral edge of the holder, namely at a peripheral edge of the wafer. This is for making the film quality, such as the thickness of an oxide film to be formed, uniform in the plane of the wafer by making the irradiation amount of ultraviolet rays uniform in the plane of the wafer.

In the case where the two ultraviolet light sources are provided at the positions described above, in order to make the film quality of the oxide film more uniform in the plane of the wafer, it is necessary to suppress output of ultraviolet rays from the ultraviolet light source provided near the center of the wafer, compared with the ultraviolet light source provided near the peripheral edge of the wafer. For example, it is necessary to set the output of the ultraviolet light source provided near the center of the wafer to 40% of the maximum output of the respective light source while setting the output of the ultraviolet light source provided near the peripheral edge of the wafer to 80% of the maximum output of the respective light source.

When forming an oxide film, it is also required to increase a formation rate of the oxide film, namely to improve a film formation throughput. As a method of increasing the formation rate of the oxide film, a method of increasing the output of an ultraviolet light source may be considered. However, in the case where two ultraviolet light sources are provided as described above, when the output of not only the ultraviolet light source provided near the center of the wafer but also the ultraviolet light source provided near the peripheral edge of the wafer is increased to approach the maximum outputs of the respective light sources, the in-plane uniformity of film quality of the wafer may be impaired.

Therefore, the technology according to the present disclosure increases the formation rate of an oxide film while maintaining the in-plane uniformity of film quality.

Hereinafter, the configuration of a substrate processing apparatus according to the present embodiment will be described with reference to the drawings. In the specification, elements having substantially the same functional configurations will be denoted by the same reference numerals, and redundant explanations thereof will be omitted.

Figure 2:
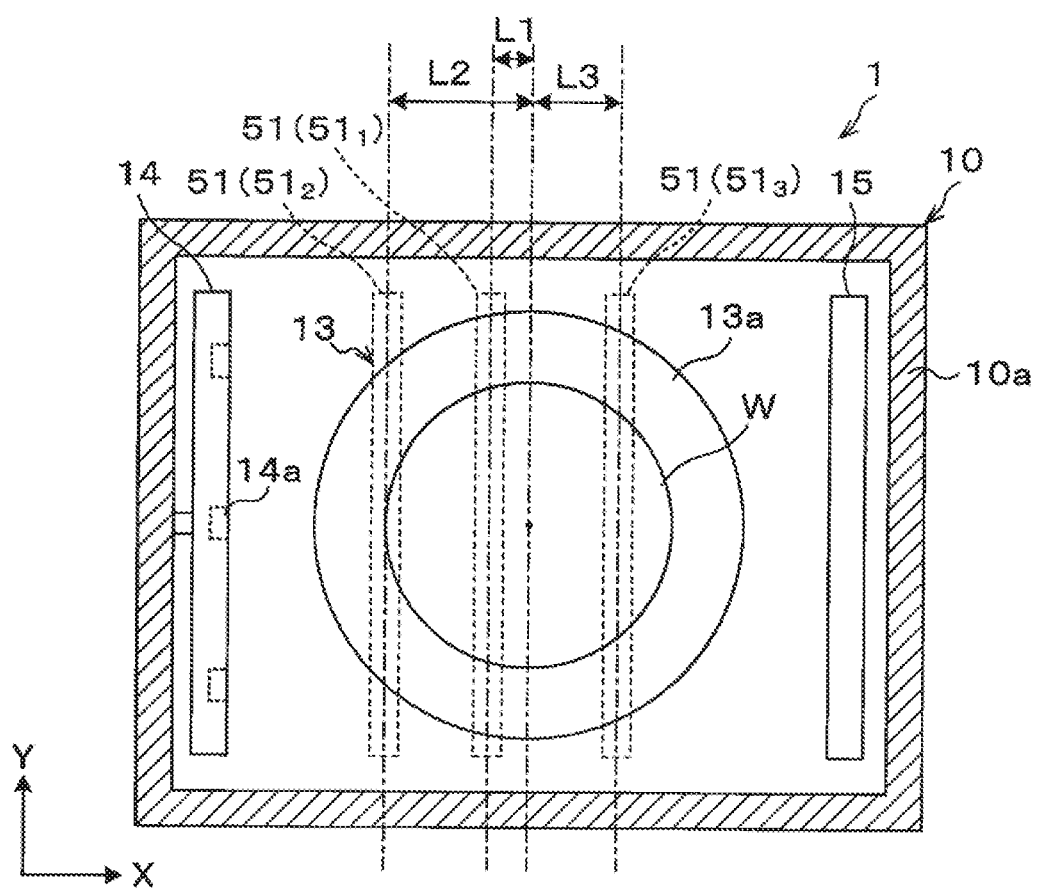
FIG. 2 is a horizontal cross-sectional view schematically illustrating an outline of a configuration of the substrate processing apparatus according to the present embodiment.

FIGS. 1 and 2 are vertical and horizontal cross-sectional views, respectively, schematically illustrating an outline of a configuration of a substrate processing apparatus according to the present embodiment. The substrate processing apparatus of the present embodiment forms a silicon oxide film on a front surface of a silicon substrate W having a diameter of 300 mm by ultraviolet radical oxidation process, and then performs remote plasma radical nitridation process so as to nitride a front surface of the silicon oxide film.

As illustrated in FIG. 1, the substrate processing apparatus 1 includes a processing container 10 configured to be capable of being depressurized and to accommodate therein a silicon substrate W (which may be referred to as a "substrate W" below).

The processing container 10 has a processing space S therein, and is configured in a rectangular parallelepiped shape using, for example, a metal material.

A loading/unloading port 11 through which the substrate W is transferred is provided in a sidewall 10a of the processing container 10. A gate valve 12 configured to open/close the loading/unloading port 11 is provided in the loading/unloading port 11.

A stage 13 as a placement part is provided inside the processing container 10. The stage 13 is formed, for example, in a circular shape in a plan view and the substrate W is horizontally placed on an upper surface 13a of the stage 13. Hereinafter, the upper surface 13a of the stage 13 is sometimes referred to as a "placement surface 13a". The stage 13 is provided with a heater (not illustrated) for heating the substrate W. In addition, the stage 13 is configured to be rotatable by being driven by a rotational driving part (not shown) with the center axis thereof as a rotation axis 13b.

A gas introduction part 14 is provided inside the processing container 10 so as to introduce an oxygen gas as a processing gas into the processing container 10. The gas introduction part 14 is disposed, for example, at a position outside the stage 13 and facing the loading/unloading port 11 in a plan view. As illustrated in FIG. 2, a plurality of injection ports 14a are formed in the gas introduction part 14 so as to be arranged in a width direction (Y-axis direction in FIG. 2). A gas supply mechanism 20 is connected to the gas introduction part 14 such that the oxygen gas can be injected into the processing space S from the injection ports 14a Specifically, one end of a supply pipe 22 is connected to a source 21 for storing the oxygen gas in the gas supply mechanism 20 and the other end thereof is connected the gas introduction part 14.

In addition, an exhaust hole 15 is formed in a bottom wall 10b of the processing container 10. The exhaust hole 15 is disposed, for example, at a position outside the stage 13 and facing the gas introduction part 14 in a plan view. An upper end of the exhaust hole 15 is exposed to the processing space S. An exhaust mechanism 30 is connected to the exhaust hole 15 such that the processing space S can be exhausted from the exhaust hole 15. Specifically, one end of an exhaust pipe 32 is connected to an exhaust device 31 including a vacuum pump and the like in the exhaust mechanism 30, and the other end there of is connected to the exhaust hole 15. Further, the exhaust hole 15 is formed to extend in a width direction (the Y-axis direction in FIG. 2).

Since the stage 13, the gas introduction part 14, and the exhaust hole 15 are in the above-described positional relationship, the oxygen gas introduced from the gas introduction part 14 passes over the stage 13 and flows toward the exhaust hole 15. In the following description, the upstream side in the flow direction of the oxygen gas is sometimes referred to as a "front side," and the downstream side thereof is sometimes referred to as a "back side."

A supply hole 16 is formed in the sidewall 10a of the processing container 10 at the front side. A remote plasma supply mechanism 40 is connected to the supply hole 16 such that nitrogen radicals can be supplied into the processing space S through the supply hole 16. Specifically, one end of supply pipe 42 is connected to a remote plasma source 41 of the remote plasma supply mechanism 40 and the other end thereof is connected to the supply hole 16. The remote plasma source 41 can activate by plasma an inert gas such as an argon gas or the like and a nitrogen-containing gas such as a nitrogen gas ($N_2$ gas) or the like supplied to the remote plasma source 41 so as to form nitrogen radicals.

An ultraviolet irradiation mechanism 50 including an ultraviolet light source 51 is installed on an upper portion on the outside of the processing container 10 such that the ultraviolet light source 51 for irradiating ultraviolet rays into the processing container 10 is located in an area facing the placement surface 13a of the stage 13. The ultraviolet irradiation mechanism 50 irradiates the processing container 10 with the ultraviolet rays from the ultraviolet light source 51 through openings 17 formed in a ceiling wall 10c of the processing container 10. The ultraviolet light source 51 is formed in a linear shape, and irradiates the processing space S of the processing container 10 with ultraviolet rays having a wavelength of 172 nm through optical windows 18 provided in the openings 17 in the ceiling wall 10c of the processing container 10. As a material of the optical window 18, a material that transmits the ultraviolet rays, for example, quartz, may be used.

Further, three ultraviolet light sources 51 are provided. Each of the ultraviolet light sources 51 is arranged to extend in a width direction (the Y-axis direction in FIG. 2). In the present embodiment, the optical windows 18 are individually provided for the three ultraviolet light sources 51, respectively.

Distances from the three ultraviolet light sources 51 to the substrate W on the stage 13 (specifically, distances from the centers of the three ultraviolet light sources 51 to an upper surface of the substrate W) are the same as one another. For example, the distance may be 120 mm to 150 mm. Further, a distance from each of the optical windows 18 to the substrate W on the stage 13 (specifically, a distance from a lower surface of each optical window 18 to the upper surface of the substrate W) is, for example, 70 mm to 120 mm.

The three ultraviolet light sources 51 are the same kind of light sources, and have the same maximum output and the same length (in the Y-axis direction in FIG. 2). In addition, the three ultraviolet light sources 51 are controlled such that the outputs from the ultraviolet light sources 51 are equal to one another when the oxide film is formed.

The three ultraviolet light sources 51 are arranged in a light source arrangement direction (the X-axis direction in FIG. 2, namely the front-back direction), which is a predetermined direction parallel to the placement surface 13a of the stage 13 in a plan view. In the present embodiment, the light source arrangement direction and the flow direction of the oxygen gas coincide with each other, and the extension direction of the ultraviolet light sources 51 and the flow direction of the oxygen gas are orthogonal to each other.

In addition, in a plan view, none of the three ultraviolet light sources 51 is located on the rotation axis 13b of the stage 13, namely the center of the substrate W placed on the stage 13. That is, the three ultraviolet light sources 51 are located to be offset from the rotation axis 13b, namely the center of the substrate W.

Further, in a plan view, the distances from the three ultraviolet light sources 51 to the rotation axis 13b of the stage 13, namely the center of the substrate W placed on the stage 13 (which is sometimes referred to as "the center of the substrate W" below), are different from one another. Details thereof are as follows.

Here, among the three ultraviolet light sources 51, the one disposed at a position closest to the center of the substrate W in a plan view will be referred to as a first ultraviolet light source 51i. In addition, the one disposed farthest from the center of the substrate W in a plan view at an area corresponding to the peripheral edge of the substrate W will be referred to as a second ultraviolet light source $51_2$. Specifically, the second ultraviolet light source $51_2$ is disposed such that the center thereof is located in an area outside the peripheral edge of the substrate W. And among the three ultraviolet light sources 51, the remaining one, other than the above ultraviolet light sources, will be referred to as a third ultraviolet light source $51_3$. At this time, assuming that the distances from the first to third ultraviolet light sources $51_1$, to $51_3$ to the center of the substrate W in a plan view are L1 to L3, respectively, the third ultraviolet light source $51_3$ is disposed to have a relationship of L1<L3<L2.

More specifically, the first ultraviolet light source $51_1$ is disposed such that the distance L1 to the center of the substrate W (hereinafter, also referred to as an "offset amount L1") is 25 mm to 50 mm, the second ultraviolet light source $51_2$ is disposed such that the distance L2 to the center of the substrate W (hereinafter, also referred to as an "offset amount L2") is 160 mm to 190 mm, and the third ultraviolet light source $51_3$ is disposed such that the distance L3 to the center of the substrate W (hereinafter, also referred to as an "offset amount L3") is 90 mm to 120 mm.

More specifically, the first to third ultraviolet light sources $51_1$ to $51_3$ are arranged at regular intervals in the light source arrangement direction (the X-axis direction in FIG. 2).

In other words, the first to third ultraviolet light sources $51_1$ to $51_3$ are arranged so as to satisfy Equation (1) below.

$$L3+L1=L2-L1 \qquad (1)$$

For example, the first ultraviolet light source $51_1$ is disposed to have the offset amount L1 of 35 mm, the second ultraviolet light source $51_2$ is disposed to have the offset amount L2 of 175 mm, and the third ultraviolet light source $51_3$ is disposed to have the offset amount L3 of 105 mm.

In the present embodiment, when the origin (reference point) in the light source arrangement direction (the X-axis direction in FIG. 2, namely the front-back direction: the upstream side in the flow direction of the oxygen gas being referred to as the front side, and the downstream side being referred to as the back side) is defined as the rotation axis of 13b of the stage 13, namely the center of the substrate W placed on the stage, the first ultraviolet light source $51_1$ and the second ultraviolet light source $51_2$ are located on the positive side in the light source arrangement direction (the positive side in the X-axis direction in FIG. 2, namely the front side). The third ultraviolet light source $51_3$ is located on the negative side in the light source arrangement direction (the negative side in the X-axis direction in FIG. 2, namely the back side).

Next, wafer processing performed using the substrate processing apparatus 1 will be described.

First, the gate valve 12 is opened, and a transfer mechanism (not illustrated), which holds the substrate W, is inserted into the processing container 10 via the loading/unloading port 11. Then, the substrate W is delivered between the transfer mechanism and the stage 13 via support pins (not illustrated). Thereafter, the transfer mechanism is withdrawn from the processing container 10, and the gate valve 12 is closed. Subsequently, the oxygen gas is supplied from the gas supply mechanism 20 into the processing space S of the processing container 10 through the gas introduction part 14, and the processing space S is exhausted by the exhaust mechanism 30. During the formation of the oxide film, an oxygen gas of 100 sccm to 1,500 sccm is introduced, and the interior of the processing container 10 is adjusted to a predetermined pressure set in a range of 0.1 Torr to 10 Torr. During the formation of the oxide film, the temperature of the substrate W is adjusted to a predetermined temperature set in a range of 500 degrees C. to 1.000 degrees C. by the heater (not illustrated) provided in the stage 13. During the formation of the oxide film, the stage 13 on which the substrate W is placed is rotated about the rotation axis 13b by the rotational driving part (not illustrated).

Thereafter, the three ultraviolet light sources 51 are driven for a predetermined period of time, and the processing space S irradiated with ultraviolet rays through the optical windows 18. The ultraviolet rays are absorbed by oxygen in the oxygen gas in the processing space S, and oxygen radicals are formed. The oxygen radicals oxidize the front surface of the substrate W. By irradiating the ultraviolet rays for the predetermined period of time, a silicon oxide film having a thickness of 0.2 nm to 2 nm is formed on the front surface of the substrate W.

Next, the driving of the ultraviolet light sources 51 and the introduction of the oxygen gas into the processing space S are stopped, and the oxygen gas inside the processing container 10 is discharged. Subsequently, nitrogen radicals generated by the remote plasma source 41 are supplied to the processing space S for a predetermined period of time. The nitrogen radicals in the remote plasma source 41 are generated by supplying an argon gas and a nitrogen gas and plasma-exciting them by high-frequency waves. During the nitridation process, a nitrogen gas of 1 sccm to 1.000 sccm and an argon gas of 100 sccm to 2,000 sccm are supplied to the remote plasma source 41, an internal pressure of the processing container 10 is adjusted to 0.01 to 50 Torr, and a temperature of the substrate W is adjusted to 500 degrees C. to 1,000 degrees C. Even during the nitridation process, the stage 13 on which the substrate W is placed is also rotated about the rotation axis 13b by the rotational driving part (not illustrated).

After the nitridation process, the substrate W is unloaded from the processing container 10 in the order opposite to the order of loading the substrate W.

As described above, in the present embodiment, three ultraviolet light sources 51 are provided, and each of these three ultraviolet light sources 51 is offset from the rotation axis 13b of the stage 13, namely from the center of the substrate W, in a plan view. In addition, the three ultraviolet light sources 51 are arranged along the light source arrangement direction in a plan view, and have different distances to the center of the substrate W. In addition, the first to third ultraviolet light sources $51_1$ to $51_3$ included in the three ultraviolet light sources 51 are arranged such that the offset amounts L1 to L3 have the positional relationship of L1<L3<L2. Therefore, the following effects are obtained.

That is, unlike the present embodiment, in a case where only the first ultraviolet light source $51_1$ and the second ultraviolet light source $51_2$ are provided and the outputs of the ultraviolet rays from the respective ultraviolet light sources 51 are equal, the irradiation amount becomes smaller in a portion closer to the outside of the stage 13 in a plan view, namely a portion closer to the outside of the substrate W. In the present embodiment, from the third ultraviolet light source $51_3$ having the same ultraviolet output as the first ultraviolet light source $51_1$ and the second ultraviolet light source $51_2$ and having the above-described positional relationship with the first ultraviolet light source $51_1$ and the second ultraviolet light source $51_2$, ultraviolet rays are irradiated to the above-mentioned portion where the irradiation amount is small. Accordingly, by the ultraviolet irradiation using the first to third ultraviolet light sources $51_1$ to $51_3$ having the same ultraviolet output, it is possible to make the irradiation amount of ultraviolet rays uniform in the plane of the substrate W in a plan view.

Since the ultraviolet outputs of the first to third ultraviolet light sources $51_1$ to $51_3$ are equal to one another, the output of each of the first to third ultraviolet light sources $51_1$ to $51_3$ including the output of the first ultraviolet light source $51_1$ provided near the center of the substrate W may be increased to the maximum output of the light source 51.

Accordingly, according to the present embodiment, it is possible to increase the formation rate of the silicon oxide film while maintaining the in-plane uniformity of the film quality, such as the film thickness.

In addition, in the present embodiment, the first ultraviolet light source $51_1$ and the second ultraviolet light source $51_2$ are located on the positive side in the light source arrangement direction, and the third ultraviolet light source $51_3$ is located on the negative side in the light source arrangement direction. Accordingly, even when each of the first to third ultraviolet light source $51_1$, $51_2$, and $51_3$ is thick, the first to third ultraviolet light sources $51_1$ to $51_3$ can be arranged such that the offset amounts L1 to L3 satisfy the positional relationship of L<L3<L2.

In addition, in the above embodiment, the number of third ultraviolet light sources $51_3$ is one, but a plurality of third ultraviolet light sources may be provided.

As described above, the substrate processing apparatus 1 includes the optical windows 18 and the ultraviolet light sources 51. The optical windows 18 may be heated to a high temperature by radiant heat from the heater (not illustrated) provided for the stage 13. At such a high temperature, the light transmittances of the optical windows 18 may decrease. Further, the ultraviolet light sources 51 may be heated to a high temperature due to their intrinsic heat generation or the like. Thus, when used at such a high temperature, the lifespan of the ultraviolet light sources 51 may be shortened. Therefore, the substrate processing apparatus 1 has a mechanism configured to cool down the optical windows 18 and the ultraviolet light sources 51 as described below.

Figure 3:
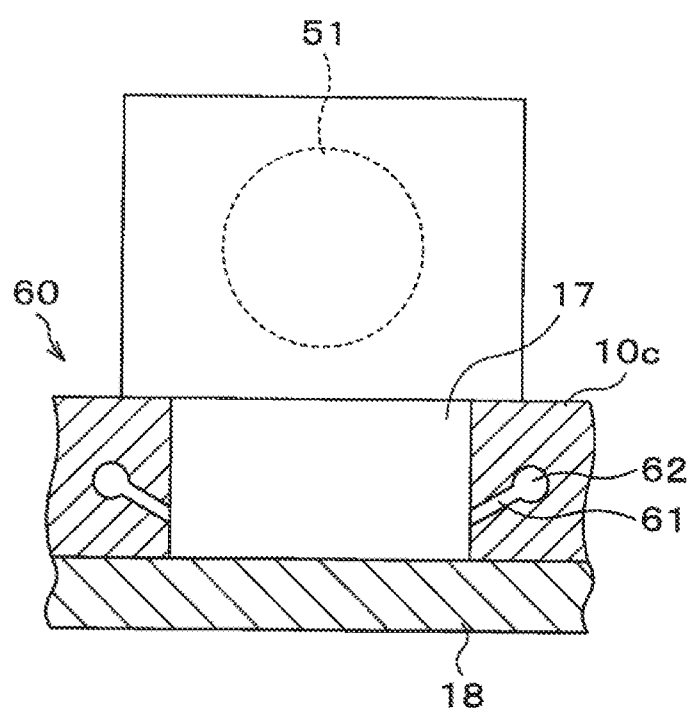
FIG. 3 is a schematic explanatory view of a gas cooling mechanism provided in the substrate processing apparatus.

FIG. 3 is a schematic explanatory view of a gas cooling mechanism 60 included in the substrate processing apparatus 1, in which the vicinity of the optical window 18 on the ceiling wall 10c of the processing container 10 is illustrated and the ceiling wall 10c is illustrated in cross section. As illustrated in FIG. 3, the gas cooling mechanism 60 is a mechanism configured to cool the optical windows 18 and the ultraviolet light sources 51 with a nitrogen gas as a cooling gas, and includes jet ports 61 and an annular path 62 formed in the ceiling wall 10c of the processing container 10.

Each jet port 61 is formed such that one end thereof is exposed at the opening 17 of the ceiling wall 10c, below which the optical window 18 is provided, and such that the nitrogen gas jetted therefrom is directed toward the optical window 18, namely downward. In the example shown in FIG. 3, a set of jet ports 61 facing each other are formed with the opening 17 interposed therebetween. A plurality of sets of jet ports 61 may be provided.

The annular path 62 is formed to be connected to the other ends of the jet ports 61 and surround the opening 17. The annular path 62 is connected to the other end of a nitrogen gas supply pipe (not illustrated). One end of the nitrogen gas supply pipe is connected to a nitrogen gas source (not illustrated).

With the above configuration, it is possible to inject the nitrogen gas from the nitrogen gas source to the optical window 18 through the nitrogen gas supply pipe, the annular path 62, and the jet ports 61. This allows cooling of the optical window 18 and thus prevents a decrease in the transmittance of the optical window 18. In addition, since the ultraviolet light source 51 disposed at a position facing the optical window 18 can also be cooled down by the nitrogen gas injected to the optical window 18, it is possible to prolong the lifespan of the ultraviolet light source.

Further, it is possible to discharge ozone, generated outside the processing container 10 by the ultraviolet rays from the ultraviolet light source 51, by the nitrogen gas injected to the optical window 18. In other words, the cooling nitrogen gas injected to the optical window 18 may also serve as a purge gas for discharging the ozone. In addition, the ozone is discharged through a discharge port (not illustrated) provided in a cover 52 (see FIG. 1) that covers the three ultraviolet light sources 51.

The cooling gas is not limited to the nitrogen gas, but may be, for example, another inert gas.

Figure 4:
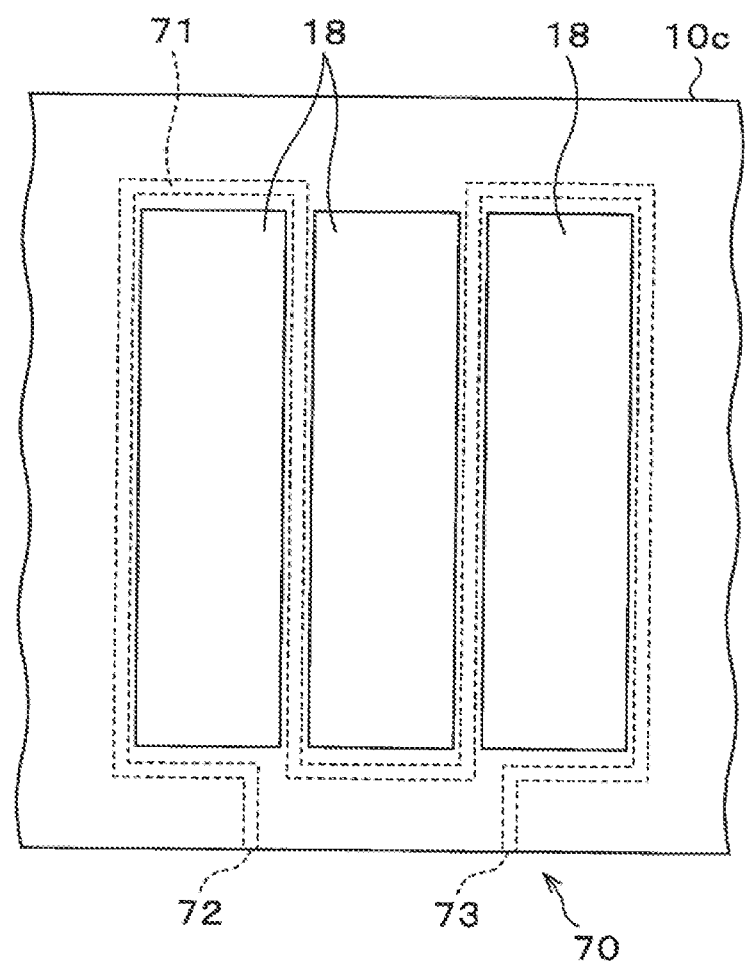
FIG. 4 is a schematic explanatory view of a liquid cooling mechanism provided in the substrate processing apparatus.

FIG. 4 is a schematic explanatory view of a liquid cooling mechanism 70 provided in the substrate processing apparatus 1, in which a partially enlarged upper surface of the ceiling wall 10c of the processing container 10 is illustrated.

As described above, the optical windows 18 are provided individually corresponding to the three ultraviolet light sources $51_1$, $51_2$, and $51_3$. In other words, three optical windows 18 are provided.

The liquid cooling mechanism 70 has a single liquid flow path 71 through which water serving as a cooling liquid flows. All of the three optical windows 18 are cooled down by the single liquid flow path 71. The single liquid flow path 71 connects a single supply port 72 and a single discharge port 73, and is formed so as to cover at least three sides of each of the rectangular optical windows 18 in a plan view. More specifically, the single liquid flow path 71 has a shape formed in a unicursal manner.

Since the liquid cooling mechanism 70 has the single supply port 72 and the single discharge port 73, it is easy to attach/detach a water supply pipe. That is, according to the present embodiment, by using a structure that is easy to attach and detach the water supply pipe, it is possible to prevent transmittances of all optical windows from being reduced.

In addition, the cooling liquid used in the liquid cooling mechanism 70 is not limited to water, and may be another liquid.

In the above example, the formation of the silicon oxide film and the nitridation process of the silicon oxide film are continuously performed inside the same processing container 10. However, the technology according to the present disclosure may also be applied to forming other silicon oxide films. In addition, the technology according to the present disclosure may be applied to forming an oxide film other than a silicon oxide film.

In the above description, the oxygen ($O_2$) gas is used as the processing gas for oxidation, but another oxygen-containing gas may be used.

In the above description, the gas introduction part 14 is provided outside the stage 13 in a plan view, and the oxygen gas as the processing gas is supplied from a lateral side of the substrate W so as to flow along the front surface of the substrate W. However, the technology according to the present disclosure may also be applied to supplying the processing gas from above so as to collide with the front surface of the substrate. That is, the technology according to the present disclosure may be applied to supplying the processing gas not only in a side-flow manner but also in a down-flow manner.

It should be noted that the embodiments disclosed herein are exemplary in all respects and are not restrictive. The above-described embodiments may be omitted, replaced or modified in various forms without departing from the scope and spirit of the appended claims.

EXAMPLES

In Examples 1 to 3, ultraviolet irradiation was performed in a simulation using the substrate processing apparatus 1 according to the present embodiment. The offset amounts L1 to L3 of the ultraviolet light sources $51_1$, $51_2$, and $51_3$ in Examples 1 to 3 were as follows, and the output of each of the ultraviolet light sources $51_1$, $51_2$, and $51_3$ was set to 80% of the maximum output thereof.

Example 1: L1=35 mm, L2=175 mm, and L3=105 mm
Example 2: L1=45 mm, L2=175 mm, and L3=110 mm
Example 3: L1=28.5 mm, L2=174.5 mm, and L3=101.5 mm In Comparative Example 1, ultraviolet irradiation was performed in a simulation using a substrate processing apparatus, which has the first to third ultraviolet light sources $51_1$ to $51_3$, similar to the substrate processing apparatus 1 according to the present embodiment, but in which the first ultraviolet light source $51_1$ is not provided to be offset. In Comparative Example 1, the offset amounts L1 to L3 of the ultraviolet light sources $51_1$, $51_2$, and $51_3$ were as follows, and the output of each of the ultraviolet light sources $51_1$, $51_2$, and $51_3$ was set to 80% of the maximum output thereof.

Comparative Example 1: L1=0 mm, L2=130 mm, and L3=175 mm

In Comparative Example 2, ultraviolet irradiation was performed in a simulation using a substrate processing apparatus, which has the first to third ultraviolet light sources $51_1$ to $51_3$, similar to the substrate processing apparatus 1 according to the present embodiment, but in which the offset amount L3 of the third ultraviolet light source $51_3$ is equal to the offset amount L2 of the second ultraviolet light source $51_2$. In Comparative Example 2, the offset amounts L to L3 of the ultraviolet light sources $51_1$, $51_2$, and $51_3$ were as follows, and the output of each of the ultraviolet light sources $51_1$, $51_2$, and $51_3$ was set to 80% of the maximum output thereof.

Comparative Example 2: L1=45 mm, L2=175 mm, and L3=175 mm

In Comparative Example 3, ultraviolet irradiation was performed in a simulation using a substrate processing apparatus, which has only the first ultraviolet light source $51_1$ and the second ultraviolet light source $51_2$, unlike the substrate processing apparatus 1 according to the present embodiment. In Comparative Example 3, the offset amounts L1 and L2 of the ultraviolet light sources $51_1$ and $51_2$ and the output of each of the ultraviolet light sources 51 and $51_2$ are as follows.

Comparative Example 3: L1=45 mm and L2=175 mm
Output of the first ultraviolet light source $51_1$=40% of the maximum output
Output of the second ultraviolet light source $51_2$=80% of the maximum output In Examples 1 to 3 and Comparative Examples 1 to 3, the distance from each of the ultraviolet light sources $51_1$, $51_2$, and $51_3$ to the upper surface of the substrate W was 136 mm, and the distance from the upper surface of the substrate W to the lower surface of each optical window 18 was 93 mm.

Figure 5:
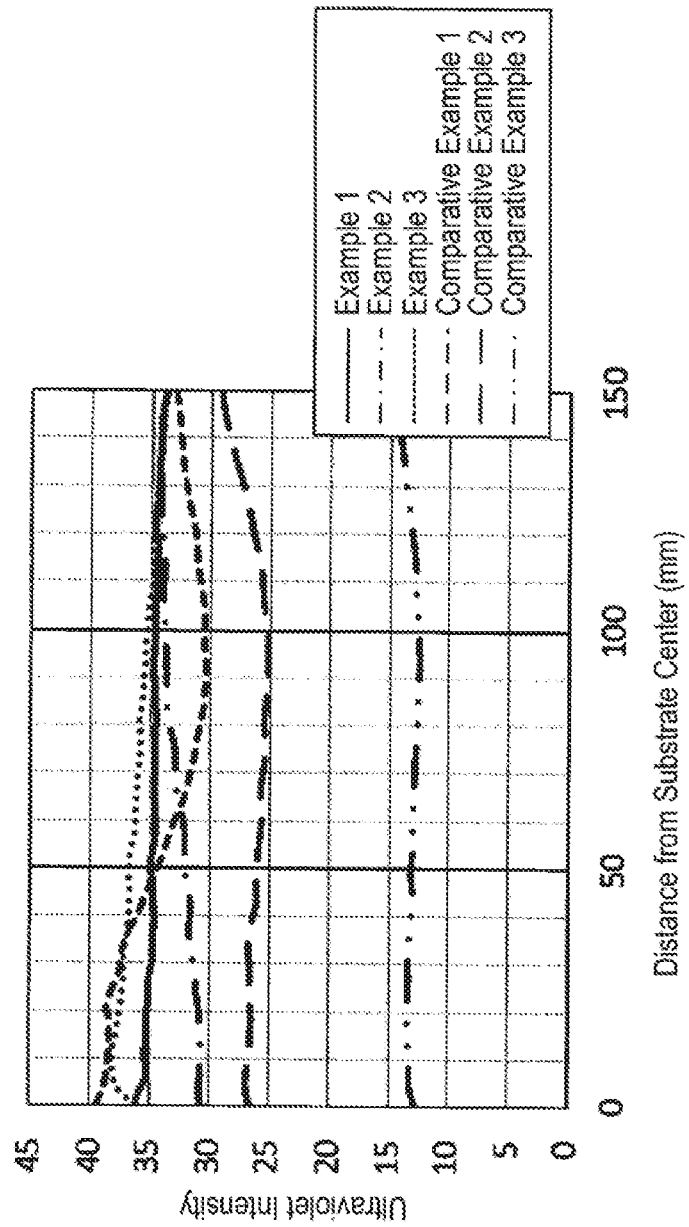
FIG. 5 is a graph illustrating in-plane distributions of ultraviolet intensities on upper surfaces of substrates in Examples 1 to 3 and Comparative Examples 1 to 3.

FIG. 5 is a graph illustrating in-plane distributions of ultraviolet intensities on the upper surfaces of substrates W in Examples 1 to 3 and Comparative Examples 1 to 3. In FIG. 5, the horizontal axis represents the distances of areas on the substrates W from the centers of the substrates W. and the vertical axis represents the ultraviolet intensities in areas on the substrates W.

As illustrated in FIG. 5, in Comparative Example 1, although the ultraviolet intensity on the upper surface of the substrate W was higher than that in Comparative Example 3, the in-plane variation was large. Specifically, assuming that an in-plane variation Δ of the ultraviolet intensity is defined as a ratio of a difference between the maximum value $I_{max}$ and the minimum value $I_{min}$ of the ultraviolet intensity with respect to the average value $I_{ave}$ of the ultraviolet intensity ($\Delta = 100 \times (I_{max} - I_{min})/I_{ave}$), the in-plane variation Δ in Comparative Example 1 exceeded 23%. In addition, in Comparative Example 2, although the in-plane variation Δ of the ultraviolet intensity was smaller than that in Comparative Example 1, the ultraviolet intensity on the upper surface of the substrate W was smaller than that in Comparative Example 1.

In contrast, in Examples 1 to 3, the ultraviolet intensity on the upper surface of each substrate W was higher than those in Comparative Examples 2 and 3, and was almost the same as in Comparative Example 1. In addition, in Examples 1 to 3, the in-plane variation Δ of the ultraviolet light intensity was smaller than those in Comparative Examples 1 and 2, and was almost the same as in Comparative Example 3. Specifically, the in-plane variation Δ of the ultraviolet intensity was 13.7% in Comparative Example 2 and 14.5% in Comparative Example 3, but was 6.9% in Example 1, 10.0% in Example 2, and 11.3% in Example 3.

In addition, a process of forming a silicon oxide film was actually performed under the same conditions as in Example 1 and Comparative Example 3 and by setting, at the time of ultraviolet irradiation, the internal pressure of the processing container 10 to 0.5 Torr, the flow rate of the oxygen gas to 450 sccm, the irradiation time to 120 seconds, and the temperature of the substrate W to 800 degrees C. In this case, under the same conditions as in Comparative Example 3, in which the number of the ultraviolet light sources 51 was two, the average thickness was 1.11 nm and a 1σ% value indicating the in-plane variation (a value obtained by dividing the standard deviation σ by the average value and expressed in percentage) was 0.80%. In contrast, under the same conditions as in Example 1, the average thickness was 1.26 nm and the 1σ% value was 0.85%. That is, according to Example 1, it is possible to increase the formation rate of the oxide film to be higher than that in Comparative Example 3 while suppressing the in-plane variation of the film thickness to be equal to that in Comparative Example 3.

The following configurations also belong to the technical scope of the present disclosure.

(1) A substrate processing apparatus for processing a substrate, includes: a processing container in which the substrate is accommodated; a stage provided inside the processing container, and configured to place the substrate thereon and rotate about a rotation axis thereof; a gas supply mechanism configured to supply a processing gas into the processing container; and at least three ultraviolet light sources provided in an area that faces a placement surface of the stage on which the substrate is placed, and configured to irradiate the processing gas inside the processing container with ultraviolet rays, wherein irradiation intensities of the ultraviolet rays irradiated from the at least three ultraviolet light sources are the same, wherein the at least three ultraviolet light sources are provided to be offset from the rotation axis of the stage in a plan view, and are arranged in a light source arrangement direction that is a predetermined direction parallel to the placement surface of the stage in a plan view with distances from the at least three ultraviolet light sources to the rotation axis of the stage being different from one another, wherein the at least three ultraviolet light sources include a first ultraviolet light source disposed closest to the rotation axis of the stage in a plan view, a second ultraviolet light source disposed at an outermost position in a plan view and arranged near a peripheral edge of the stage, and a third ultraviolet light source other than the first and second ultraviolet light sources, and wherein the third ultraviolet light source is arranged such that distances L1, L2, and L3 from the first ultraviolet light source, the second ultraviolet light source, and the third ultraviolet light source, respectively, to the rotation axis of the stage in a plan view satisfies a relationship of L1<L3<L2.

According to (1) above, it is possible to increase a formation rate of an oxide film while ensuring in-plane uniformity of film quality.

(2) In the substrate processing apparatus of (1) above, the distances from the at least three ultraviolet light sources to the placement surface of the stage are equal to one another.

(3) In the substrate processing apparatus of (1) or (2) above, the at least three ultraviolet light sources are arranged at regular intervals in the light source arrangement direction.

(4) In the substrate processing apparatus of any one of (1) to (3) above, each of the first ultraviolet light source, the second ultraviolet light source, and the third ultraviolet light source is a single light source.

(5) In the substrate processing apparatus of (4) above, when an origin in the light source arrangement direction is the rotation axis of the stage, the first ultraviolet light source and the second ultraviolet light source are located on a positive side with respect to the origin in the light source arrangement direction, and the third ultraviolet light source is located on a negative side with respect to the origin in the light source arrangement direction.

According to (5) above, it is possible to arrange the first to third ultraviolet light sources such that a positional relationship of L1 to L3 becomes L1<L3<L2 even when each of the first to third ultraviolet light sources is wide in width.

(6) In the substrate processing apparatus of (4) or (5) above, the first ultraviolet light source, the second ultraviolet light source, and the third ultraviolet light source are arranged so as to satisfy a relationship of L3+L1=L2−L1.

(7) In the substrate processing apparatus of (6) above, the substrate has a diameter of 300 mm, and the distance L1, the distance L2, and the distance L3 are 35 mm, 175 mm, and 105 mm, respectively.

(8) In the substrate processing apparatus of any one of (1) to (7) above, the at least three ultraviolet light sources are provided outside the processing container, and the processing container includes optical windows configured to transmit the ultraviolet rays irradiated from the at least three ultraviolet light sources.

(9) In the substrate processing apparatus of (8) above further includes a gas cooling mechanism configured to cool down at least one of the at least three ultraviolet light sources and the optical windows using a cooling gas.

According to (9) above, it is possible to prevent a reduction in transmittance of the optical window and prolong the lifespan of the ultraviolet light source.

(10) In the substrate processing apparatus of (9) above, ozone generated outside the processing container by the ultraviolet rays irradiated from the at least three ultraviolet light sources is discharged by the cooling gas.

(11) In the substrate processing apparatus of any one of (8) to (10) above further includes: a liquid cooling mechanism configured to cool down the optical windows provided respectively to the at least three ultraviolet light sources using a cooling liquid, and the liquid cooling mechanism cools down all the optical windows provided respectively to the at least three ultraviolet light sources using a single flow path through which the cooling liquid flows.

According to (11) above, it is possible to prevent a reduction in transmittance of all of the optical windows by using a structure that is easy to attach and detach a cooling supply pipe.

(12) In the substrate processing apparatus of any one of (1) to (11) above further includes a radical supply mechanism configured to supply radicals to a predetermined oxide film which is formed by radicals generated when the processing gas supplied into the processing container absorbs the ultraviolet rays irradiated from the ultraviolet light source.

(13) There is provided a method of processing a substrate using a substrate processing apparatus. The substrate processing apparatus includes: a processing container in which the substrate is accommodated; a stage provided inside the processing container, and configured to place the substrate thereon and rotate about a rotation axis thereof; and at least three ultraviolet light sources provided in an area that faces a placement surface of the stage on which the substrate is placed, and configured to irradiate the processing gas inside the processing container with ultraviolet rays, wherein irradiation intensities of the ultraviolet rays irradiated from the at least three ultraviolet light sources are the same, wherein the at least three ultraviolet light sources are provided to be offset from the rotation axis of the stage in a plan view, and are arranged in a light source arrangement direction that is a predetermined direction parallel to the placement surface of the stage in a plan view with distances from the at least three ultraviolet light sources to the rotation axis of the stage are different from one another, wherein the at least three ultraviolet light sources include a first ultraviolet light source disposed closest to the rotation axis of the stage in a plan view, a second ultraviolet light source disposed at an outermost position in a plan view and arranged near a peripheral edge of the stage, and a third ultraviolet light source other than the first and second ultraviolet light sources, and wherein the third ultraviolet light source is arranged such that distances L1. L2 and L3 from the first ultraviolet light source, the second ultraviolet light source and the third ultraviolet light source, respectively, to the rotation axis of the stage in a plan view satisfies a relationship of L1<L3<L2. The method includes supplying a processing gas into the processing container and irradiating, by the at least three ultraviolet light sources, the processing gas with the ultraviolet rays. The irradiation intensities of the ultraviolet rays irradiated from the at least three ultraviolet light sources are equal to one another.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A substrate processing apparatus for processing a substrate, comprising:
   a processing container in which the substrate is accommodated;
   a stage provided inside the processing container, and configured to place the substrate thereon and rotate about a rotation axis thereof;
   a gas supply mechanism configured to supply a processing gas containing an oxygen gas into the processing container; and
   at least three ultraviolet light sources provided in an area that faces a placement surface of the stage on which the substrate is placed, and configured to irradiate the oxygen gas inside the processing container with ultraviolet rays to form an oxide film on the substrate,
   wherein irradiation intensities of the ultraviolet rays irradiated from the at least three ultraviolet light sources are the same,
   wherein the at least three ultraviolet light sources are provided to be offset from the rotation axis of the stage in a plan view, and are arranged in a light source arrangement direction that is a predetermined direction parallel to the placement surface of the stage in a plan view with distances from the at least three ultraviolet light sources to the rotation axis of the stage being different from one another,
   wherein the at least three ultraviolet light sources include a first ultraviolet light source disposed closest to the rotation axis of the stage in a plan view, a second ultraviolet light source disposed at an outermost position in a plan view and arranged near a peripheral edge of the stage, and a third ultraviolet light source other than the first and second ultraviolet light sources, and
   wherein the third ultraviolet light source is arranged such that distances L1, L2, and L3 from the first ultraviolet light source, the second ultraviolet light source, and the third ultraviolet light source, respectively, to the rotation axis of the stage in a plan view satisfies a relationship of L1<L3<L2.

2. The substrate processing apparatus of claim 1, wherein the distances from the at least three ultraviolet light sources to the placement surface of the stage are equal to one another.

3. The substrate processing apparatus of claim 2, wherein the at least three ultraviolet light sources are arranged at regular intervals in the light source arrangement direction.

4. The substrate processing apparatus of claim 3, wherein each of the first ultraviolet light source, the second ultraviolet light source, and the third ultraviolet light source is a single light source.

5. The substrate processing apparatus of claim 4, wherein, when an origin in the light source arrangement direction is the rotation axis of the stage, the first ultraviolet light source and the second ultraviolet light source are located on a positive side with respect to the origin in the light source arrangement direction, and the third ultraviolet light source is located on a negative side with respect to the origin in the light source arrangement direction.

6. The substrate processing apparatus of claim 5, wherein the first ultraviolet light source, the second ultraviolet light source, and the third ultraviolet light source are arranged so as to satisfy a relationship of L3+L1=L2−L1.

7. The substrate processing apparatus of claim 6, wherein the substrate has a diameter of 300 mm, and the distance L1, the distance L2, and the distance L3 are 35 mm, 175 mm, and 105 mm, respectively.

8. The substrate processing apparatus of claim 7, wherein the at least three ultraviolet light sources are provided outside the processing container, and
   wherein the processing container includes optical windows configured to transmit the ultraviolet rays irradiated from the at least three ultraviolet light sources.

9. The substrate processing apparatus of claim 8, further comprising:
   a gas cooling mechanism configured to cool down at least one of the at least three ultraviolet light sources and the optical windows using a cooling gas.

10. The substrate processing apparatus of claim 9, wherein ozone generated outside the processing container by the ultraviolet rays irradiated from the at least three ultraviolet light sources is discharged by the cooling gas.

11. The substrate processing apparatus of claim 10, further comprising:
a liquid cooling mechanism configured to cool down the optical windows provided respectively to the at least three ultraviolet light sources using a cooling liquid,
wherein the liquid cooling mechanism cools down all the optical windows provided respectively to the at least three ultraviolet light sources using a single flow path through which the cooling liquid flows.

12. The substrate processing apparatus of claim 11, further comprising:
a radical supply mechanism configured to supply radicals to the oxide film which is formed by radicals generated when the processing gas supplied into the processing container absorbs the ultraviolet rays irradiated from the ultraviolet light source.

13. The substrate processing apparatus of claim 1, wherein the at least three ultraviolet light sources are arranged at regular intervals in the light source arrangement direction.

14. The substrate processing apparatus of claim 1, wherein each of the first ultraviolet light source, the second ultraviolet light source, and the third ultraviolet light source is a single light source.

15. The substrate processing apparatus of claim 14, wherein the first ultraviolet light source, the second ultraviolet light source, and the third ultraviolet light source are arranged so as to satisfy a relationship of L3+L1=L2−L1.

16. The substrate processing apparatus of claim 1, wherein the at least three ultraviolet light sources are provided outside the processing container, and
wherein the processing container includes optical windows configured to transmit the ultraviolet rays irradiated from the at least three ultraviolet light sources.

17. The substrate processing apparatus of claim 16, further comprising:
a liquid cooling mechanism configured to cool down the optical windows provided respectively to the at least three ultraviolet light sources using a cooling liquid,
wherein the liquid cooling mechanism cools down all the optical windows provided respectively to the at least three ultraviolet light sources using a single flow path through which the cooling liquid flows.

18. The substrate processing apparatus of claim 1, further comprising:
a radical supply mechanism configured to supply radicals to the oxide film which is formed by radicals generated when the processing gas supplied into the processing container absorbs the ultraviolet rays irradiated from the ultraviolet light sources.

19. A method of processing a substrate using a substrate processing apparatus,
wherein the substrate processing apparatus includes:
a processing container in which the substrate is accommodated;
a stage provided inside the processing container, and configured to place the substrate thereon and rotate about a rotation axis thereof; and
at least three ultraviolet light sources provided in an area that faces a placement surface of the stage on which the substrate is placed, and configured to irradiate a processing gas inside the processing container with ultraviolet rays,
wherein irradiation intensities of the ultraviolet rays irradiated from the at least three ultraviolet light sources are the same,
wherein the at least three ultraviolet light sources are provided to be offset from the rotation axis of the stage in a plan view, and are arranged in a light source arrangement direction that is a predetermined direction parallel to the placement surface of the stage in a plan view with distances from the at least three ultraviolet light sources to the rotation axis of the stage are different from one another,
wherein the at least three ultraviolet light sources include a first ultraviolet light source disposed closest to the rotation axis of the stage in a plan view, a second ultraviolet light source disposed at an outermost position in a plan view and arranged near a peripheral edge of the stage, and a third ultraviolet light source other than the first and second ultraviolet light sources, and
wherein the third ultraviolet light source is arranged such that distances L1, L2 and L3 from the first ultraviolet light source, the second ultraviolet light source and the third ultraviolet light source, respectively, to the rotation axis of the stage in a plan view satisfies a relationship of L1<L3<L2,
the method comprising:
supplying the processing gas containing an oxygen gas into the processing container and irradiating, by the at least three ultraviolet light sources, the oxygen gas with the ultraviolet rays to form an oxide film on the substrate,
wherein the irradiation intensities of the ultraviolet rays irradiated from the at least three ultraviolet light sources are equal to one another.

* * * * *